(12) United States Patent
Mackh et al.

(10) Patent No.: US 9,040,389 B2
(45) Date of Patent: May 26, 2015

(54) SINGULATION PROCESSES

(71) Applicant: Infineon Technologies AG, Neubiberg (DE)

(72) Inventors: Gunther Mackh, Neumarkt (DE); Maria Heidenblut, Schwarzenfeld (DE); Adolf Koller, Regensburg (DE); Anatoly Sotnikov, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/648,216

(22) Filed: Oct. 9, 2012

(65) Prior Publication Data

US 2014/0099777 A1    Apr. 10, 2014

(51) Int. Cl.
*H01L 21/78* (2006.01)
*H01L 21/683* (2006.01)

(52) U.S. Cl.
CPC ............ *H01L 21/78* (2013.01); *H01L 21/6835* (2013.01); *H01L 21/6836* (2013.01); *H01L 2221/68327* (2013.01); *H01L 2221/68336* (2013.01); *H01L 2221/6834* (2013.01)

(58) Field of Classification Search
CPC ............ H01L 41/338; H01L 21/76894; H01L 21/6836; H01L 21/78; H01L 51/5253; H01L 2221/6834; H01L 21/6835
USPC ...................... 438/463, 33, 68, 113, 458, 460; 257/E21.238, E21.596, E21.599
See application file for complete search history.

(56) References Cited

U.S. PATENT DOCUMENTS

| | | | |
|---|---|---|---|
| 6,075,280 A | 6/2000 | Yung et al. | |
| 7,087,452 B2 | 8/2006 | Joshi et al. | |
| 7,629,229 B2 | 12/2009 | Morikazu | |
| 7,901,967 B2 | 3/2011 | Komura et al. | |
| 7,947,574 B2 * | 5/2011 | Sakamoto et al. | 438/460 |
| 7,955,955 B2 | 6/2011 | Lane et al. | |
| 8,017,942 B2 * | 9/2011 | Mariani et al. | 257/48 |
| 8,071,429 B1 | 12/2011 | Qian et al. | |
| 8,247,734 B2 * | 8/2012 | Fukuyo et al. | 219/121.66 |
| 2003/0124771 A1 * | 7/2003 | Maiz | 438/113 |
| 2004/0113283 A1 | 6/2004 | Farnworth et al. | |
| 2005/0277270 A1 | 12/2005 | Yoshikawa et al. | |

(Continued)

FOREIGN PATENT DOCUMENTS

| | | | |
|---|---|---|---|
| JP | 2005340423 A | | 12/2005 |
| JP | 2007150206 A | * | 6/2007 |

(Continued)

OTHER PUBLICATIONS

Birkholz, M. et al. "Separation of extremely miniaturized medical sensors by IR laser dicing", Journal of Optoelectronics and Advanced Materials, vol. 12, No. 3, Mar. 2010, pp. 479-483.

(Continued)

*Primary Examiner* — Jarrett Stark
*Assistant Examiner* — Bitew Dinke
(74) *Attorney, Agent, or Firm* — Slater & Matsil, L.L.P.

(57) ABSTRACT

In one embodiment, a method of forming a semiconductor device comprises forming a groove on and/or over a first side of a substrate. A dicing layer is formed from a second side of the substrate using a laser process. The second side is opposite the first side. The dicing layer is disposed under the groove within the substrate. The substrate is singulated through the dicing layer.

29 Claims, 13 Drawing Sheets

(56) References Cited

U.S. PATENT DOCUMENTS

| | | | |
|---|---|---|---|
| 2006/0040472 A1* | 2/2006 | Tamura et al. | 438/460 |
| 2006/0079024 A1* | 4/2006 | Akram | 438/110 |
| 2006/0216911 A1* | 9/2006 | Yoshikawa et al. | 438/460 |
| 2007/0066044 A1 | 3/2007 | Abe et al. | |
| 2007/0111478 A1* | 5/2007 | Komura et al. | 438/462 |
| 2007/0128834 A1* | 6/2007 | Nakamura | 438/460 |
| 2007/0141810 A1* | 6/2007 | Nakamura | 438/460 |
| 2007/0207594 A1* | 9/2007 | Tamura | 438/463 |
| 2007/0257365 A1 | 11/2007 | Lu et al. | |
| 2007/0293020 A1 | 12/2007 | Pressel et al. | |
| 2008/0094087 A1 | 4/2008 | Lee | |
| 2008/0121819 A1 | 5/2008 | Tanaka et al. | |
| 2008/0153264 A1 | 6/2008 | Nakamura et al. | |
| 2008/0268619 A1 | 10/2008 | Nakamura | |
| 2009/0121321 A1 | 5/2009 | Miccoli et al. | |
| 2009/0121337 A1* | 5/2009 | Abe et al. | 257/686 |
| 2009/0203193 A1* | 8/2009 | Morikazu et al. | 438/463 |
| 2009/0215245 A1 | 8/2009 | Nakamura | |
| 2009/0294913 A1 | 12/2009 | Kawashima | |
| 2009/0298263 A1* | 12/2009 | Watanabe et al. | 438/463 |
| 2010/0015782 A1 | 1/2010 | Yu et al. | |
| 2010/0015784 A1 | 1/2010 | Nakamura et al. | 438/464 |
| 2010/0041210 A1* | 2/2010 | Hoshino et al. | 438/463 |
| 2010/0047969 A1 | 2/2010 | Kim et al. | |
| 2010/0081235 A1* | 4/2010 | Furumura | 438/113 |
| 2010/0127355 A1 | 5/2010 | Mariani et al. | |
| 2010/0173474 A1 | 7/2010 | Arita et al. | |
| 2010/0227453 A1* | 9/2010 | Sakamoto | 438/463 |
| 2010/0267219 A1 | 10/2010 | Kajiyama | |
| 2011/0024882 A1 | 2/2011 | Takemura et al. | |
| 2011/0204412 A1* | 8/2011 | Sugano | 257/103 |
| 2011/0304007 A1 | 12/2011 | Watanabe | |
| 2012/0040510 A1* | 2/2012 | Yoo | 438/462 |
| 2012/0074565 A1* | 3/2012 | Koroku | 257/737 |
| 2012/0100694 A1* | 4/2012 | Kajiyama et al. | 438/462 |
| 2012/0211748 A1* | 8/2012 | Miccoli et al. | 257/52 |
| 2012/0234807 A1* | 9/2012 | Sercel et al. | 219/121.69 |
| 2012/0235282 A1* | 9/2012 | Tomono et al. | 257/618 |
| 2013/0049234 A1* | 2/2013 | Lin et al. | 257/787 |
| 2013/0078408 A1* | 3/2013 | Niino et al. | 428/43 |
| 2013/0234149 A1* | 9/2013 | Halderman et al. | 257/76 |

FOREIGN PATENT DOCUMENTS

| | | |
|---|---|---|
| JP | 2008153638 A | 7/2008 |
| JP | 2010016361 A | 1/2010 |
| JP | 2010093187 A | 4/2010 |

OTHER PUBLICATIONS

Borkulo, Jeroen van, et al. "Multi Beam Grooving and Full Cut Laser Dicing of IC Wafers", ALSI, platinawerf 20G, 6641TL Beuningen Netherlands, 8 pages, ECS Trans. 2012, vol. 44.

Kim, DoHyung, et al.,"Evaluation for UV Laser Dicing Process and its Reliability for Various Designs of Stack Chip Scale Package", 2009 Electronic Components and Technology Conference, 6 pages.

"Laser Application" Disco Corporation, Kiru-Kezuru, Migaku Technologies, Tokyo, Japan, 8 pages.

Mariani, et al, "Current Challenges in Preassemebly The Focus Changes from Thinning to Singulation", Infineon Technologies, 2007 Die Products Consortium, KGD Packaging & Test Workshop, Sep. 9-12, 2007, Napa,California, 29 pages.

"Stealth Dicing Technical Information for MEMS", Hamamatsu Photonics K.K., Sep. 2011, Taiwan, 16 pages.

"Stealth Dicing Technology and Applications", Hamamatsu Photonics K.K., Mar. 2005, Iwata City, Japan, 8 pages.

* cited by examiner

SINGULATION PROCESSES

TECHNICAL FIELD

The present invention relates generally to electronic devices, and more particularly to singulation processes.

BACKGROUND

Semiconductor devices are used in many electronic and other applications. Semiconductor devices may comprise integrated circuits that are formed on semiconductor wafers. Alternatively, semiconductor devices may be formed as monolithic devices, e.g., discrete devices. Semiconductor devices are formed on semiconductor wafers by depositing many types of thin films of material over the semiconductor wafers, patterning the thin films of material, doping selective regions of the semiconductor wafers, etc.

In a conventional semiconductor fabrication process, a large number of semiconductor devices are fabricated in a single wafer. After completion of device level and interconnect level fabrication processes, the semiconductor devices on the wafer are separated. For example, the wafer may undergo singulation. During singulation, the wafer is mechanically treated and the semiconductor devices are physically separated to form individual dies. Purely mechanical separation is not very space efficient, which results in a wastage of silicon area that could otherwise be used to produce more chips per wafer. However, alternatives to mechanical separation require overcoming many difficult process issues.

SUMMARY OF THE INVENTION

In accordance with an embodiment of the present invention, a method of forming a semiconductor device comprises forming a groove at a first side of a substrate, and forming a dicing layer from a second side of the substrate. The dicing layer is disposed under the groove within the substrate. The second side is opposite the first side. The method further comprises singulating the substrate through the dicing layer.

In accordance with an embodiment of the present invention, a method of forming a semiconductor device comprises forming a groove through a metallization layer disposed over a substrate using a first laser process. The method further includes forming a dicing layer under the groove within the substrate using a second laser process. The substrate is attached to a tape and a tape expansion process is performed on the tape with the substrate.

In accordance with an embodiment of the present invention, a method of forming a semiconductor device comprises thinning a substrate having a first side and an opposite second side. A groove is formed in a dicing channel of the substrate from the first side of the substrate. A dicing layer comprising a plurality of defects is formed under the groove in the dicing channel. A crack is formed through the dicing layer to the groove by generating a tensile stress in the substrate.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A and 1B, illustrates a semiconductor substrate after formation of device regions and metallization layers, wherein FIG. 1A illustrates a cross-sectional view and FIG. 1B illustrates a top view;

FIG. 2, which includes FIGS. 2A-2B, illustrates the semiconductor device prior to exposure to a laser grooving process in accordance with an embodiment of the present invention, wherein FIG. 2A illustrates a cross-sectional view and FIG. 2B illustrates a top view;

FIG. 3, which includes FIGS. 3A-3B, illustrates the semiconductor device during laser grooving process in accordance with an embodiment of the present invention, wherein FIG. 3A illustrates a cross-sectional view and FIG. 3B illustrates a top view;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In semiconductor fabrication, substantial amount of real estate on a silicon wafer may be lost to dicing channels or dicing streets, which are regions that separate adjacent dies. This wastage, which results in lower number of useful dies per wafer, is more acute in case of small sized dies. Therefore, the area of the dicing regions has to be decreased. However, reducing the area of the dicing regions using conventional mechanical dicing results in improper dicing, e.g., removing a part of the actual chip or creation of defects that may propagate and limit the lifetime of the product.

Accordingly, alternative methods of dicing are needed for using narrow dicing channels. Alternative processes such as chemical, plasma etching processes and laser processes are being explored to form narrow dicing channels. However, each of these processes has limitations as described further below. For example, chemical etching processes cannot practically (within a reasonable time) etch (dice) through the complete wafer. Further, plasma dicing process cannot etch through metal layers. On the other hand, laser processes, such as backside stealth dicing, which can be performed at a fast speed, cannot remove metal layers. Therefore, metal structures in the dicing channels have to be removed and moved to other areas of the wafer, for example, by the creation of dummy dies.

Alternatively, front side laser processes such as ablation laser work by ablation of the surface and require multiple passes. Ablation laser processes impart large amounts of energy into the substrate being diced. Therefore, ablation laser processes result in high residual stresses and uneven chip sidewall, which can result in subsequent delamination of different layers within the chip. Alternatively, low laser power levels need to be used to obtain smooth sidewalls (no chipping or cracks) with the ablation laser process. However, low laser power levels decrease the removal rate of the material of the substrate and therefore reduce the speed of the dicing process.

FIGS. 1-7 illustrate a method of fabricating a semiconductor die in accordance with an embodiment of the invention. FIGS. 8-9 and FIGS. 10-11 illustrate alternative embodiments of fabricating the semiconductor die.

Figure 1A:
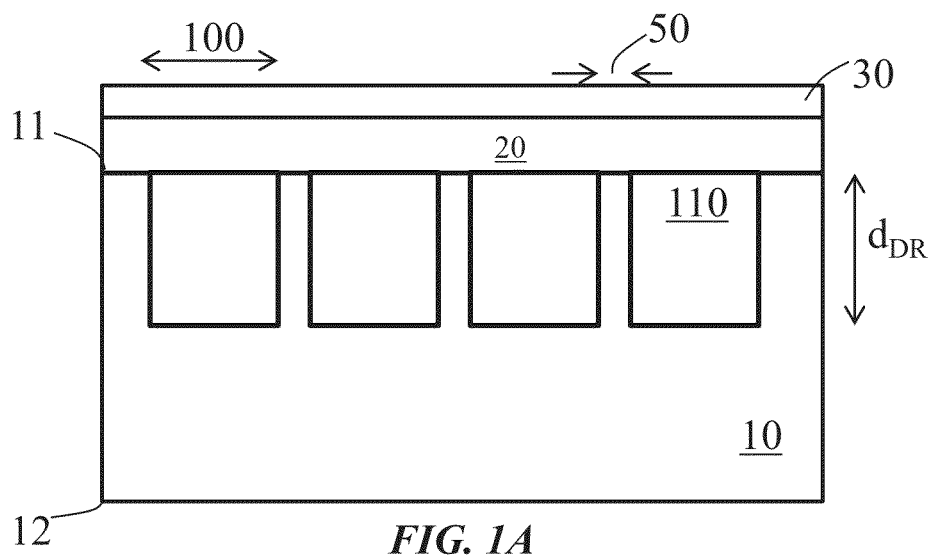
Figure 1B:
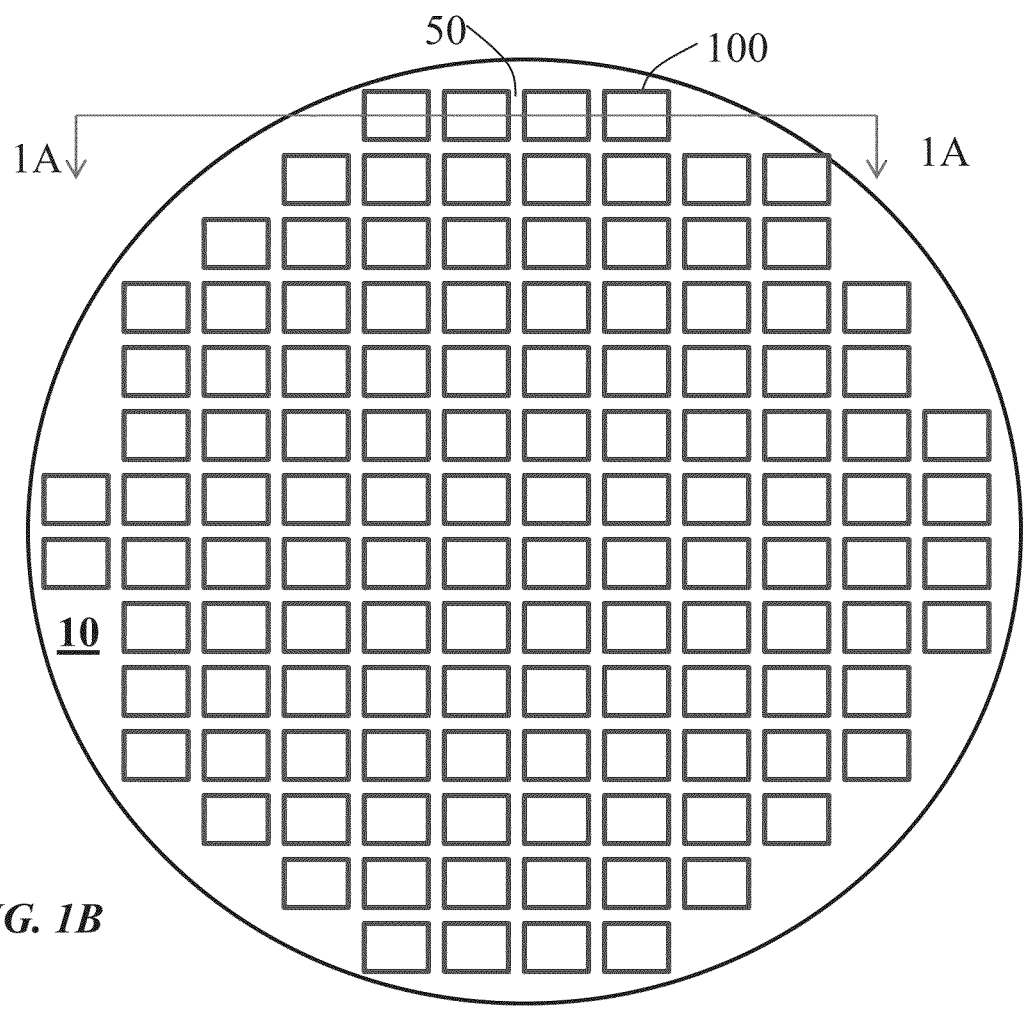

FIG. 1, which includes FIGS. 1A and 1B, illustrates a semiconductor substrate after formation of device regions and metallization layers, wherein FIG. 1A illustrates a cross-sectional view and FIG. 1B illustrates a top view.

Referring to FIG. 1A, a semiconductor substrate 10 after the completion of front end processing and back end processing is illustrated. The semiconductor substrate 10 has a plurality of semiconductor devices, i.e., chips 100, formed within. Each chip of the chips 100 may be any type of chip. For example, each of the chips 100 may be a logic chip, a memory chip, an analog chip, and other types of chips. Each of the chips 100 may comprise a plurality of devices such as transistors or diodes forming an integrated circuit or may be a discrete device such as a single transistor or a single diode.

In one embodiment, the substrate 10 may comprise a semiconductor wafer such as a silicon wafer. In other embodiments, the substrate 10 may be a wafer comprising other semiconductor materials including alloys such as SiGe, SiC or compound semiconductor materials such as GaAs, InP, InAs, GaN, sapphire, silicon on insulation, for example.

Referring to FIG. 1A, device regions 110 are disposed within the substrate 10. The device regions 110 may include doped regions in various embodiments. Further, some portion of the device regions 110 may be formed over the substrate 10. The device regions 110 may include active regions such as channel regions of transistors.

The substrate 10 comprises a top surface 11 and an opposite bottom surface 12. In various embodiments, the device regions 110 are formed closer to the top surface 11 of the substrate 10 than the bottom surface 12. Active devices may be formed in device regions 110 of the substrate 10. Device regions 110 extends over a depth $d_{DR}$, which depending on the device, is about 10 µm to about 200 µm, and about 50 µm in one embodiment.

In various embodiments, all necessary interconnects, connections, pads etc. for coupling between devices of the device regions 110 and/or with external circuitry are formed over the substrate 10. Accordingly, a metallization layer 20 is formed over the substrate 10. The metallization layer 20 may comprise one or more levels of metallization. Each level of metallization may comprise metal lines or vias embedded within an insulating layer. The metallization layer 20 may comprise metal lines and vias to contact the device regions 110 and also to couple different devices within each chip 100.

A protective layer 30, such as a passivation layer, may be formed over the metallization layer 20 before further processing. The protective layer 30 may comprise an oxide, nitride, polyimide, or other suitable materials known to one skilled in the art. The protective layer 30 may comprise a hard mask in one embodiment, and a resist mask in another embodiment. The protective layer 30 helps to protect the metallization layer 20 as well as the device regions 110 during subsequent processing.

Further, a final depth of the chip 100 will be determined after thinning as will be described subsequently. The bottom surface of the device regions 110 is therefore shown as dashed lines.

FIG. 1B illustrates a top view of the substrate 10 comprising a plurality of chips. Each chip 100 is separated from each other by a plurality of regions called scribe lines or dicing channels 50. The dicing channels 50 may comprise additional circuitry or other structures, which may be used for testing. As will be described subsequently, embodiments of the invention enable flexibility in adding such additional circuitry and structures.

Figure 2A:
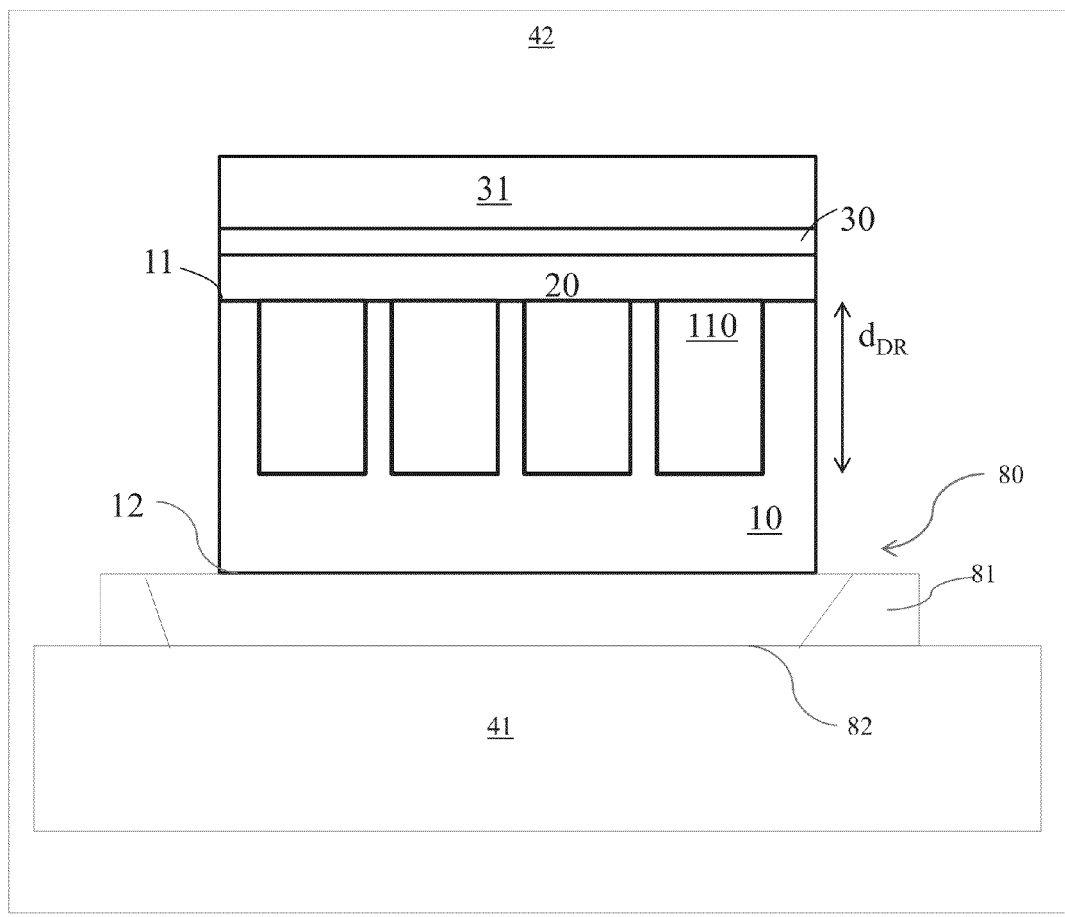
Figure 2B:
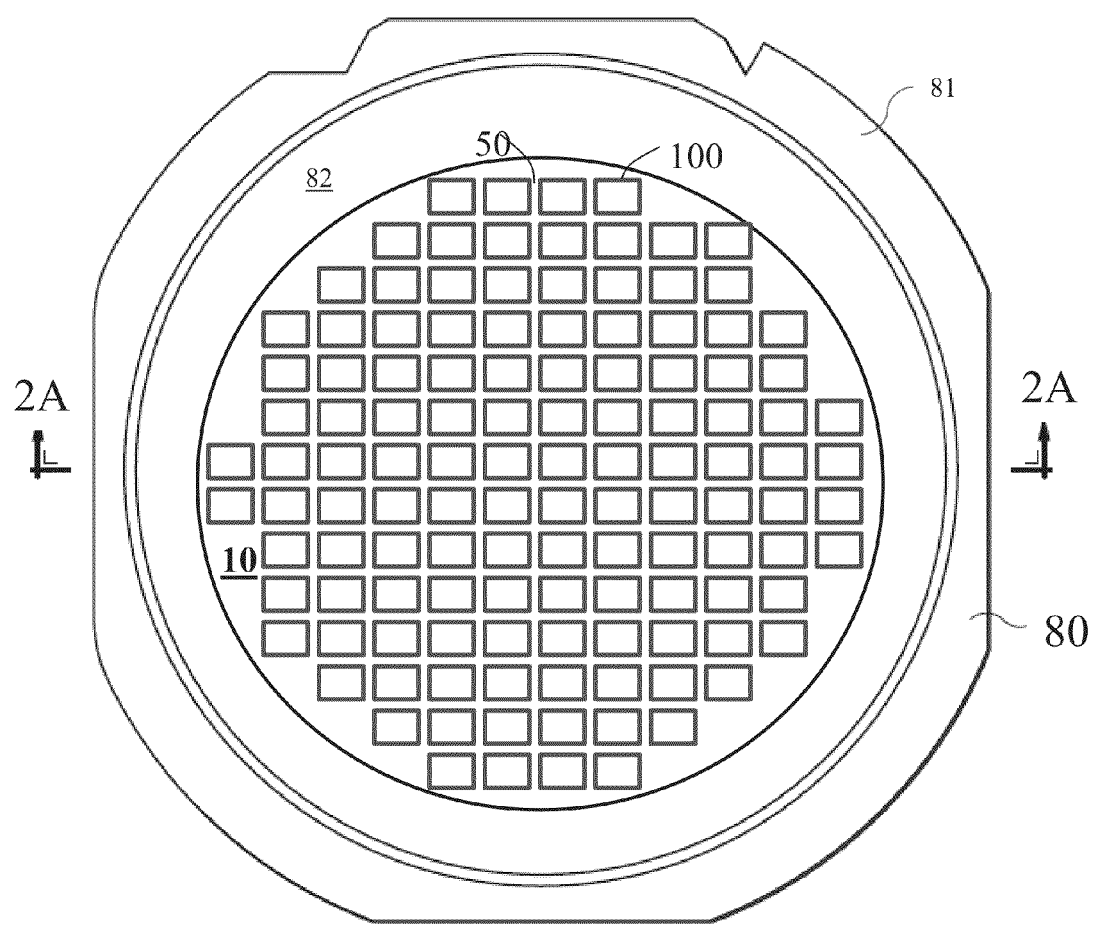

FIG. 2, which includes FIGS. 2A-2B, illustrates the semiconductor device prior to exposure to a laser grooving process in accordance with an embodiment of the present invention. FIG. 2A illustrates a cross-sectional view and FIG. 2B illustrates a top view.

As illustrated in FIG. 2B, the substrate 10 is positioned over a carrier 80 in one or more embodiments. The carrier 80 may comprise a frame with an adhesive tape in one embodiment. Alternatively, in other embodiments, the carrier may comprise other suitable material to securely hold the substrate 10 during processing.

In one embodiment, the carrier 80 comprises a frame 81, which is an annular structure (ring shaped) with an adhesive foil 82. The adhesive foil 82 is supported along the outer edges by the frame 81 in one or more embodiments. In another embodiment, the carrier 80 may comprise an adhesive tape having a substrate, e.g., polyvinyl chloride, with the coating of an adhesive layer such as an acrylic resin. In one or more embodiments, the frame 81 comprises a supporting material such as a metal or ceramic material. In various embodiments, the inside diameter of the frame 81 is greater than the diameter of the substrate 10. In alternative embodiments, the frame 81 may comprise other suitable shapes.

As illustrated in FIG. 2B, the substrate is firmly secured over the central part of the carrier 80 in one or more embodiments using the adhesive foil 82. Accordingly, the substrate 10 may be securely handled during the subsequent laser grooving process described below.

Referring to the cross-sectional view of FIG. 2A, the front side of the substrate 10 may be covered with the protective coating 31 in one or more embodiments. In one embodiment, the protective coating 31 may be a water soluble protective film designed to prevent adhesion of the debris generated during the laser ablation process. Alternatively, in other embodiments, the protective coating 31 may be other types of film, e.g., in one illustration may be soluble in other liquids. In some embodiments, the protective coating 31 may be skipped because less debris is created in embodiments of the invention due to the limited depth of the groove.

As illustrated in FIG. 2A, the substrate 10 held by the carrier 80 may be placed over a chuck 41 of a laser tool chamber 42 with the front surface formed with the device regions 110 facing upside. The substrate 10 may be secured and held by vacuum suction operation in various embodiments. In addition, the frame 81 may be held by clamps.

Figure 3A:
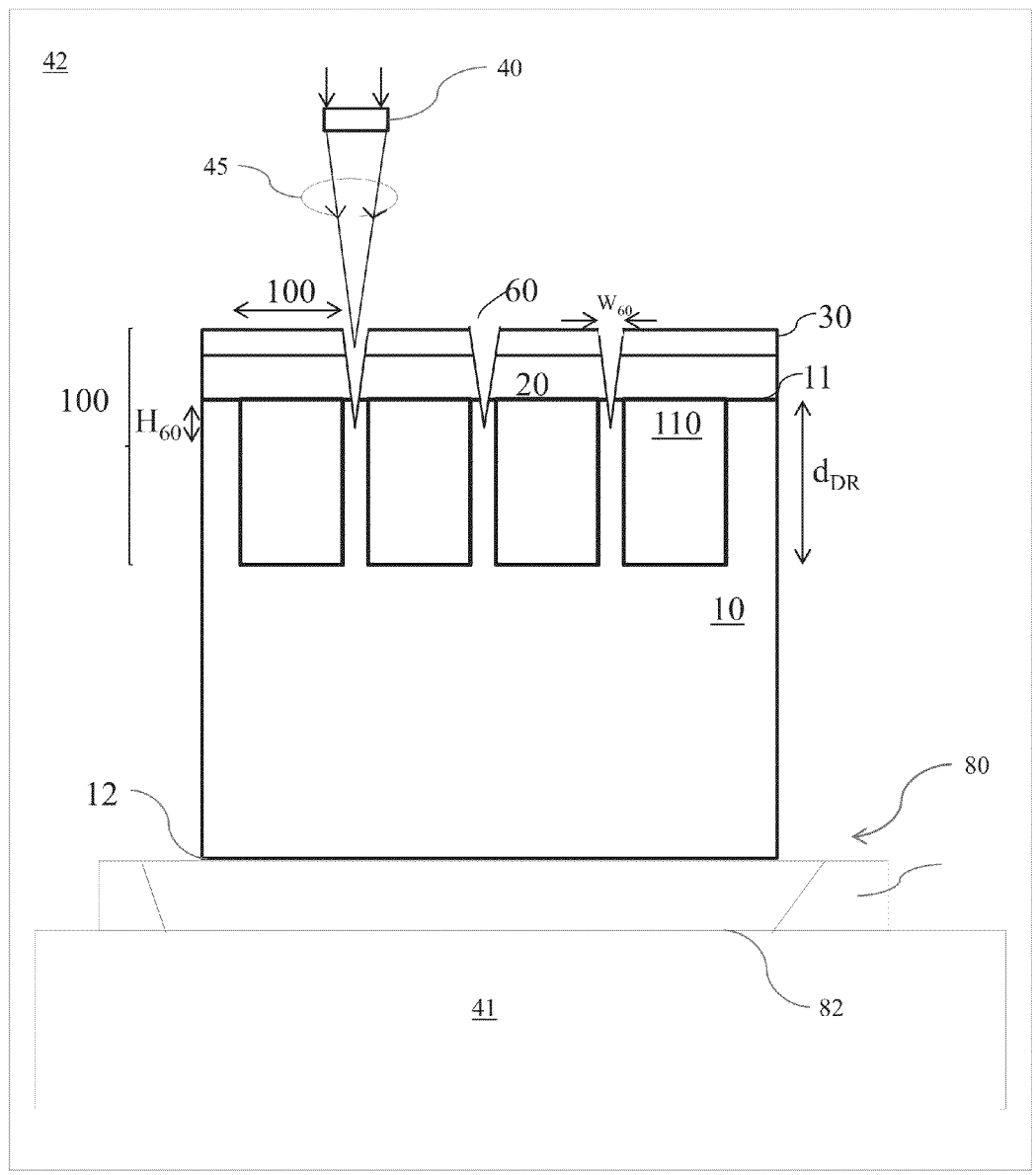
Figure 3B:
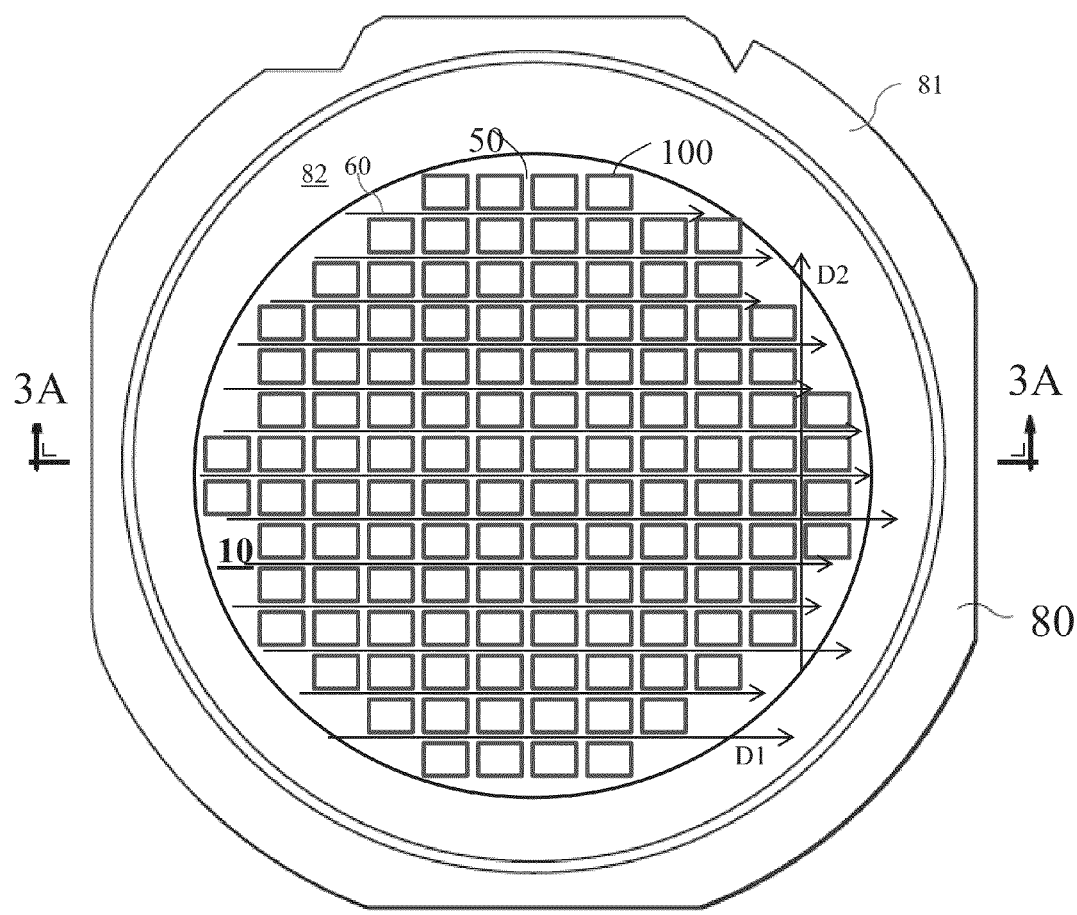

FIG. 3, which includes FIGS. 3A-3B, illustrates a semiconductor device during laser grooving process in accordance with an embodiment of the present invention.

In various embodiments, the substrate 10 and/or the laser tool 40 may be moved to align the substrate 10 relative to the laser tool 40. Alignment marks on the surface of the substrate 10 may be used for this purpose.

As illustrated, a laser tool 40 focuses a laser beam 45 onto the surface of the substrate 10. The material of the substrate 10 is removed by irradiation of laser pulses which locally generate a combination of melt and vapor. The pressure of the vapor pushes the melt out of the substrate thereby forming a groove 60 (FIG. 3). The laser beam 45 is absorbed by the metallization layer 20, which sublimes due to the energy of the laser beam 45. The wavelength, the pulse width, and the intensity of the laser beam 45 may be adjusted to form a groove 60 having smooth sidewalls. In various embodiments, the laser beam 45 comprises infrared wavelength. For example, the laser tool 40 may comprise a infrared pulsed lasers such as diode-pumped pulsed neodymium-doped yttrium aluminum garnet laser crystal (Nd:YAG) source, neodymium-doped yttrium orthovanadate (Nd:YVO4), neodymium-doped yttrium lithium fluoride (Nd:YLF) in one or more embodiments. In an alternative embodiment, the laser tool 40 may comprise a laser operating at any wavelength between ultraviolet and infrared, for example, the laser tool 40 may be an ultra violet laser in one embodiment.

Referring to FIG. 3B, the laser beam 45 may be scanned along each of the dicing channels 50 along a first direction D1. Thus, trench like grooves 60 are formed oriented along the first direction D1. In various embodiments, the scanning motion may be performed by moving the laser beam 45 relative to the substrate 10 either in the positive first direction D1 or the negative first direction −D1.

In various embodiments, the grooves 60 extend into the substrate 10. In one or more embodiments, the depth of the grooves $H_{60}$ within the substrate 10 is about 1 μm to about 50 μm. In one or more embodiments, the depth of the grooves $H_{60}$ within the substrate 10 is about 5 μm to about 20 μm. However, in some embodiments, the grooves 60 may not extend into the substrate 10. For example, the grooves 60 may extend only through the protective layer 30 and the metallization layer 20 to the top surface of the substrate 10.

In various embodiments, the grooves 60 are formed using a single scan process. Alternatively, in some embodiments, the grooves 60 may be formed using more than one scan, for example, two scans with different power and frequency.

After completing the scanning along all the dicing channels 50 oriented along the first direction D1, the chuck 41 and/or a scanning tool of the laser tool 40 is rotated by 90° so as to change the scanning direction from the first direction D1 to a second direction D2. After any necessary realignment, the grooves 60 are formed along the second direction D1 through all the parallel dicing channels 50.

Figure 4:
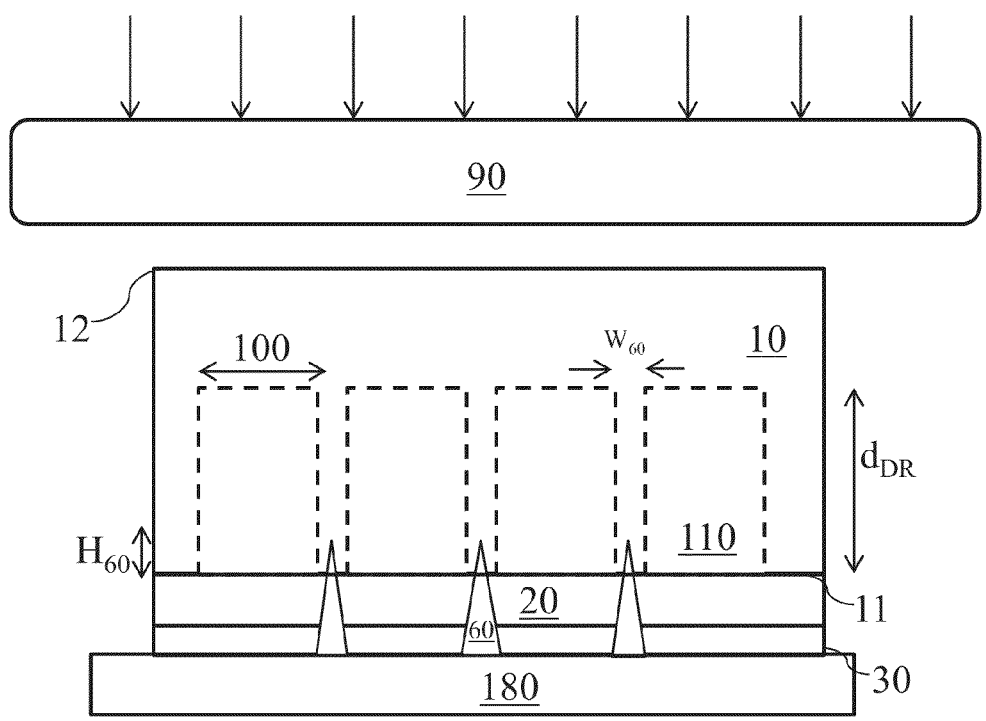
FIG. 4 illustrates a cross-sectional view of the semiconductor device during a subsequent back side thinning process in accordance with an embodiment of the invention.

FIG. 4 illustrates the semiconductor device during a subsequent back side thinning process in accordance with an embodiment of the invention.

Referring to FIG. 4, the substrate 10 is removed from the laser tool 40 and separated from the carrier 80. The front side of the substrate 10 having the grooves 60 is placed over another carrier, i.e., a second carrier 180. The second carrier 180 may be the same or different from the carrier 80. The second carrier 180 securely holds the substrate 10 during the subsequent thinning process.

In various embodiments, the substrate 10 is thinned from the back side so as to expose the device regions 110. In various embodiments, the thinning may be performed using a grinding process, a chemical etching, a chemical mechanical etching, and combinations thereof. In one or more embodiments, the thinning process may include a grinding process and/or a polishing process. In one embodiment, the thinning may be performed using a grinding tool 90.

Figure 5:
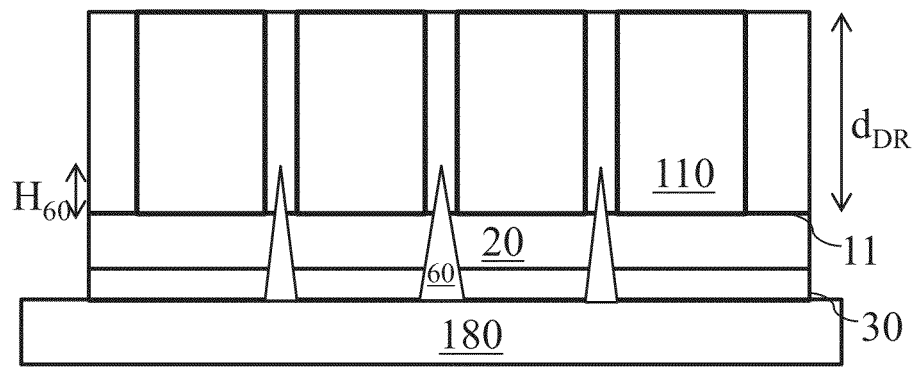
FIG. 5 illustrates a cross-sectional view of the semiconductor device after a back side thinning process in accordance with an embodiment of the present invention.

FIG. 5 illustrates the semiconductor device after a back side thinning process in accordance with an embodiment of the present invention.

As illustrated, after the completion of the thinning process, the substrate 10 has a thickness of about the depth $d_{DR}$. In various embodiments, the substrate 10 has a thickness of about 10 μm to about 200 μm after the thinning process. In various embodiments, the thickness of the substrate 10 after the thinning is about 20 μm to about 100 μm, and 80 μm to about 120 μm in one embodiment. In another embodiment, the thickness of the substrate 10 after the thinning is about 50 μm to about 100 μm. In another embodiment, the thickness of the substrate 10 after the thinning is about 20 μm to about 50 μm. In another embodiment, the thickness of the substrate 10 after the thinning is about 10 μm to about 20 μm. In another embodiment, the thickness of the substrate 10 after the thinning is at least 10 μm. In another embodiment, the thickness of the substrate 10 after the thinning is at least 20 μm. In another embodiment, the thickness of the substrate 10 after the thinning is at least 50 μm. In another embodiment, the thickness of the substrate 10 after the thinning is less than 100 μm. In another embodiment, the thickness of the substrate 10 after the thinning is less than 80 μm. In another embodiment, the thickness of the substrate 10 after the thinning is less than 50 μm. In another embodiment, the thickness of the substrate 10 after the thinning is less than 30 μm. The final thickness of the substrate 10 may be selected based on the mechanical stability, need for reducing resistances, and others.

Figure 6:
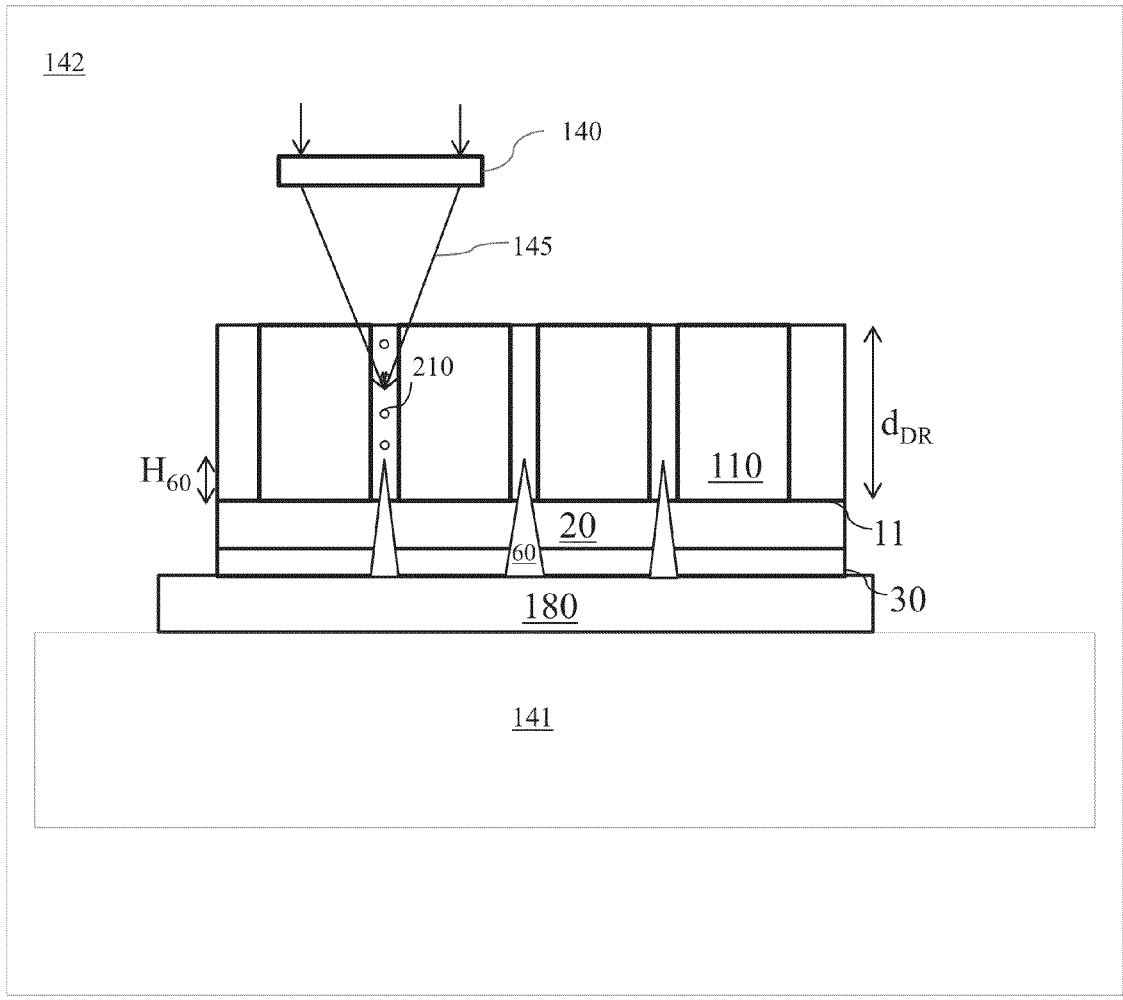
FIG. 6 illustrates a cross-sectional view of the semiconductor device during a back side stealth laser dicing process in accordance with an embodiment of the present invention.

FIG. 6 illustrates the semiconductor device during a back side stealth dicing process in accordance with an embodiment of the present invention.

Figure 7:
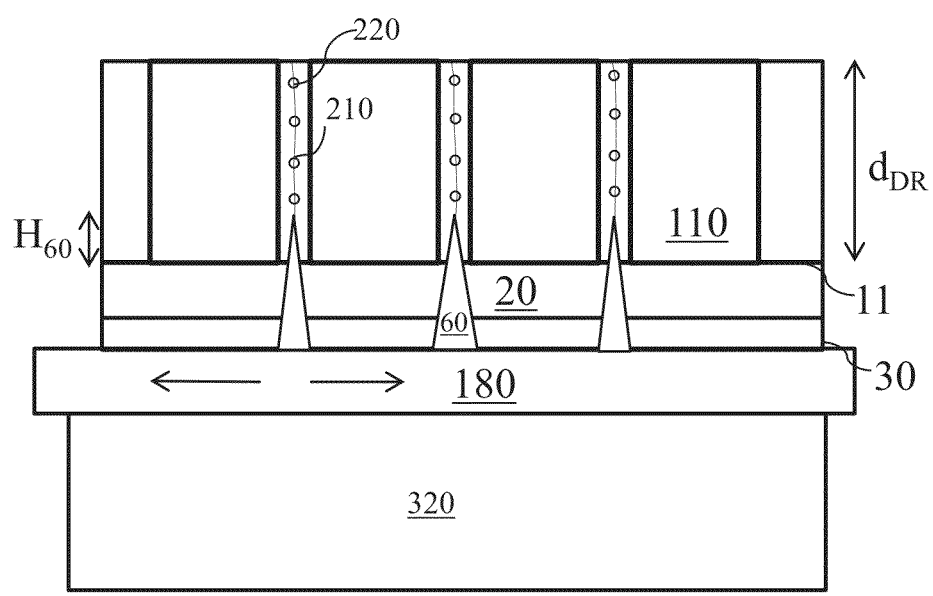
FIG. 7 illustrates a cross-sectional view of the semiconductor device during a tape expansion process in accordance with an embodiment of the present invention.

The stealth dicing process is a two-step process which includes a stealth laser process and a subsequent expansion process, which completes the singulation. FIG. 6 illustrates the stealth laser process while FIG. 7 illustrates the expansion process in accordance with an embodiment of the present invention.

Referring to FIG. 6, the substrate 10 is placed within a chamber 142 of a stealth laser tool 140. The second carrier 180 may be securely positioned over a chuck 141 of the stealth laser tool 140 using vacuum. After placing the substrate 10, which is attached to the second carrier 180 within the chamber of the stealth laser tool 140, the substrate 10 is aligned with the stealth laser beam 145 of the stealth laser tool 140. The alignment process may be performed from the back side of the substrate 10 using light wavelength that is transparent to the substrate 10, for example, using an infrared camera alignment system.

In various embodiments, the stealth laser tool 140 is configured to generate a stealth laser beam 145. In particular, the stealth laser beam 145 is generated at a light wavelength that is semitransparent to the material of the substrate 10. As a consequence, the stealth laser beam 145 may be focused on to a point inside the substrate 10, which may then form a starting point for a crack, which completes the dicing process.

In a conventional laser ablation process, the energy of the laser beam is absorbed within the surface layers of the substrate 10. In contrast, the stealth laser beam 145 uses wavelengths that are transmitted through the substrate 10 so that the stealth laser beam 145 is guided to the focal point inside the substrate 10, which allows localized laser dicing within the substrate 10. Advantageously, stealth laser dicing avoids damaging the surface layers comprising the device regions.

Therefore, as illustrated, a stealth laser beam 145 is focused on to a narrow region (point) within the dicing channel 50. In various embodiments, the stealth laser beam 145 comprises short pulses oscillating at a high repetition rate, which may be highly condensed to form a localized beam having an extremely high peak power density spatially and temporally compressed at the focus point. At the focus point, the energy of the stealth laser beam 145 is locally absorbed. However, outside the focus point, the transmitting stealth laser beam 145 is not significantly absorbed by the substrate 10 due to the non-linear absorption property of the material of the substrate 10, e.g., silicon. In case of silicon, the absorption behavior changes at about 1000 nm. For example, monocrystalline silicon substrates absorb light at wavelengths shorter than 1000 nm but allow light longer than 1000 nm to transmit through. Therefore, laser ablation dicing processes use shorter wavelengths (e.g., <1000 nm) such that the surface layers absorb the energy of the laser beam so as to melt and evaporate the substrate 10 while stealth laser dicing processes use longer wavelengths (>900 nm or >1000 nm) so that the laser beam can be focused on to small regions deep inside the substrate 10.

Referring to FIG. 6, focusing the stealth laser beam 145 into the substrate 10 results in the formation of a stealth dicing layer 210. In various embodiments, the stealth dicing layer 210 is a highly defective state and may include large amount of stress after the scanning of the stealth laser beam 145. In one or more embodiments, the stealth dicing layer 210 may include localized recrystallized polycrystalline material (such as polysilicon) of the substrate 10, micro cracks, dislocations, and other defects generated due to the stealth laser beam 145. In various embodiments, the property of the stealth laser beam 145 may be controlled such that the stealth dicing layer 210 does not include cracks propagating from the top surface 11 to the opposite bottom surface of the substrate 10.

In various embodiments, the stealth laser beam 145 is scanned multiple times through the dicing channel 50 so as to produce a uniform stealth dicing layer 210. For example, the focus point of the stealth laser beam 145 may be adjusted progressively with each scan so as to focus deeper (or shallower) in each subsequent scan. In one or more embodiments, the stealth dicing layer 210 may be generated using 3-10 scans. Advantageously, due to the presence of the groove 60, less number of scans is needed during the stealth laser dicing process.

In various embodiments, similar to the laser beam 45, the stealth laser beam 145 may be scanned across the dicing channels 50 along the first and the second directions D1 and D2. Further, multiple scans may be performed to generate a controlled and uniform stealth dicing layer 210.

Advantageously, stealth laser dicing is a clean process producing minimal or no debris onto the surface of the substrate 10 during the laser dicing process. Further, the heat distribution is narrower relative to a laser ablation process. In contrast, conventional laser dicing processes utilize wavelengths that are highly absorbed by the material that is being diced. Therefore, such methods result in significant heat and debris during the dicing process.

Further, the stealth dicing process depends strongly on the material type of the substrate 10 and is not suitable for dicing through metal layers. However, as described previously, the groove 60 is already being formed through the metallization layers. Therefore, by combining the back side stealth dicing process with a front side grooving process, embodiments of the invention achieve dicing without introducing the negative effects of the back side stealth dicing process or the front side laser ablation process. In the absence of the front side laser ablation process as described in various embodiments, the layout of the wafer has to be changed, e.g., all the metal structures have to be moved out of the dicing channel. In contrast, using a combination of the front side laser ablation process with the back side stealth dicing process, such changes are not essential and therefore the layout may be optimized for other parameters such as for improving silicon efficiency.

FIG. 7 illustrates a semiconductor device during the tape expansion process in accordance with an embodiment of the present invention.

In various embodiments, the semiconductor wafer is singulated and the dicing completed using a tape expansion process, which cracks the wafer through the stealth dicing layer 210 formed in the previous step.

Referring to FIG. 7, the second carrier 180 may be expanded in various embodiments. In one or more embodiments, the second carrier 180 may be placed over the expander 320, which may be a heater in one embodiment. The expander 320 expands the second carrier 180 laterally as shown by the arrows. This generates a tensile stress within the substrate 10. In alternative embodiments the expander 320 may use other techniques to generate a tensile stress within the second carrier 180.

The tensile stress in the substrate 10 initiates a crack 220 from the groove 60 through the stealth dicing layer 210. In various embodiments, the groove 60 behaves like a crack nucleation site.

Alternatively, in some embodiments, the substrate 10 may be removed from the second carrier 180 and placed on a tape, which may be subsequently expanded as described above. The dicing process is completed when the cracks 220 from the grooves 60 reach the exposed bottom surface of the substrate 10. After the dicing, individual chips are formed.

Figure 8:
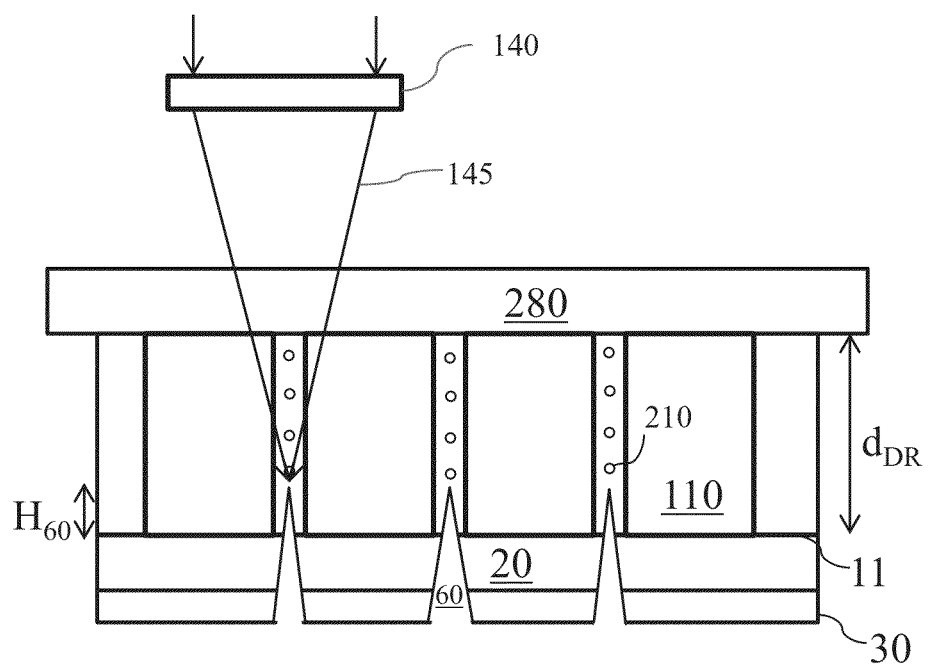
FIG. 8 illustrates a cross-sectional view of a semiconductor device during a stealth dicing laser process in accordance with an alternative embodiment of the present invention.
Figure 9:
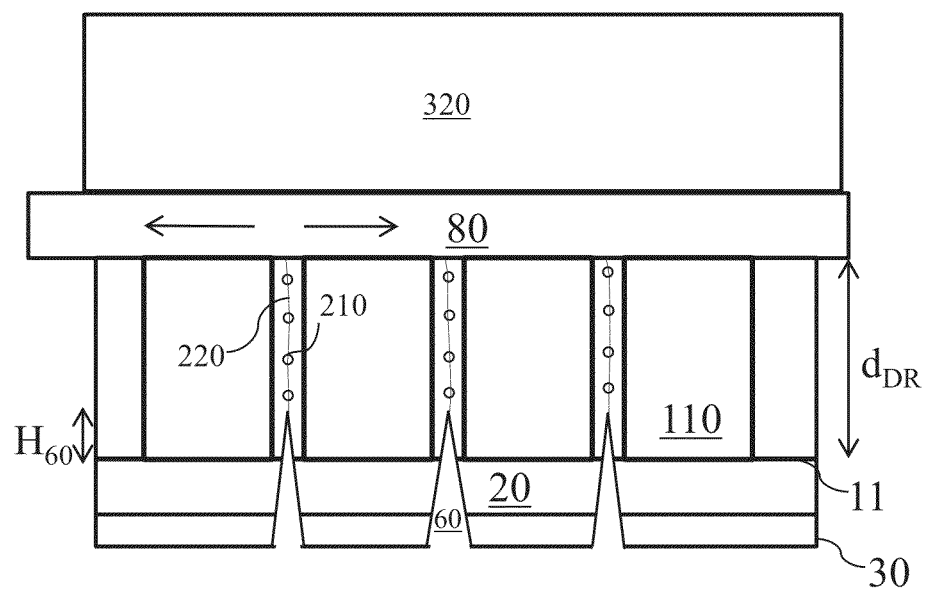
FIG. 9 illustrates a cross-sectional view of the semiconductor device after expansion in accordance with an alternative embodiment of the present invention.

FIGS. 8 and 9 illustrate an alternative embodiment in which the stealth dicing process is performed through a transparent tape.

FIG. 8 illustrates a semiconductor device during a stealth dicing laser process in accordance with an alternative embodiment of the present invention.

In this embodiment, processing proceeds as described in FIGS. 1-5. However, as illustrated in FIG. 8, the second carrier 180 is removed and a third carrier 280 is attached to the exposed back surface of the substrate 10. In one or more embodiments, the third carrier 280 may comprise a tape, which is transparent to the wavelength used by the stealth laser tool 140.

Referring to FIG. 8, the stealth dicing process may be performed as described above by scanning a stealth laser beam 145 through the third carrier 280 into the substrate 10.

FIG. 9 illustrates a semiconductor device after expansion in accordance with an embodiment of the present invention.

As described in prior embodiments, the tape of the third carrier 280 may be expanded, for example, using an expander 320, which results in the formation of cracks 220 thereby completing the dicing process.

Figure 10:
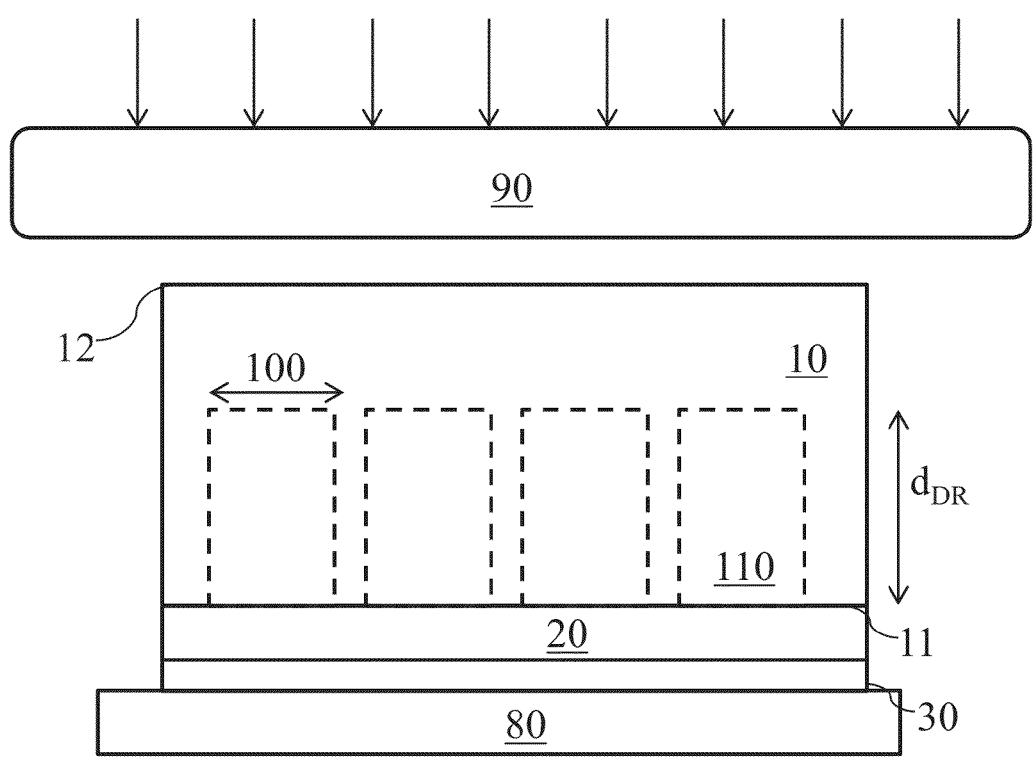
FIG. 10 illustrates a cross-sectional view of a semiconductor device during a thinning process in accordance with an alternative embodiment of the present invention.
Figure 11:
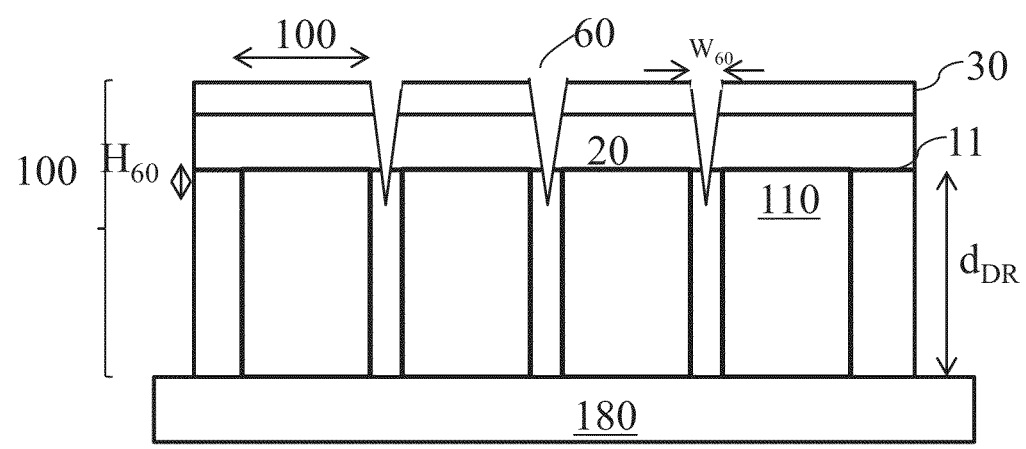
FIG. 11 illustrates a cross-sectional view of the semiconductor device after forming grooves using a laser ablation process in accordance with an alternative embodiment of the present invention.

FIGS. 10 and 11 illustrates a dicing process in accordance with an alternative embodiment of the present invention. In this embodiment, the back side thinning process is performed prior to the grooving process.

FIG. 10 illustrates the semiconductor device during a thinning process in accordance with an alternative embodiment of the present invention. As illustrated in FIG. 10, the substrate 10 is mounted onto a carrier 80 after forming the device regions 110, metallization layers 20, and protective layer 30 as described with respect to FIG. 1. The carrier 80 may be similar to the carrier 80 described using FIG. 2 in one embodiment. Using a grinding tool 90, the bottom surface 12 of the substrate 10 is thinned as described previously in prior embodiments.

FIG. 11 illustrates the semiconductor device after forming grooves using a laser ablation process in accordance with an embodiment of the present invention. As illustrated in FIG. 11, the carrier 80 is removed or detached from front side of the substrate 10 and a second carrier 180 is attached to the bottom surface exposed after the thinning process. The grooves 60 may be formed using a laser ablation process as described previously with respect to FIGS. 2 and 3. Subsequent processing including stealth laser dicing and expansion may continue as described in prior embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-7 may be combined with the embodiments described in FIGS. 8-9 and/or FIGS. 10-11. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
    forming a groove at a first side of a silicon substrate, the groove extending partially into the silicon substrate without extending through the silicon substrate, the silicon substrate comprising doped regions, wherein the silicon substrate comprises active device regions proximate the first side;
    forming a dicing layer from a second side of the silicon substrate, the dicing layer disposed under the groove within the silicon substrate, the second side being opposite the first side, wherein forming the groove comprises using a laser ablation process using light at a wavelength between ultraviolet and infrared, and wherein forming the dicing layer comprises using a stealth laser process using light at a wavelength above 900 nm; and
    singulating the silicon substrate through the dicing layer and the groove, wherein the singulating comprises attaching the silicon substrate to a tape, and
        forming a crack from the groove through the dicing layer by expanding the tape.

2. The method of claim 1, wherein the stealth laser dicing process uses wavelength of light more than about 1000 nm.

3. The method of claim 1, wherein the groove is formed within a dicing channel on the silicon substrate.

4. The method of claim 3, wherein the dicing layer is formed within the dicing channel of the silicon substrate.

5. The method of claim 1, wherein the groove has a depth of about 1 µm to about 50 µm in the silicon substrate.

6. The method of claim 1, wherein the groove extends through a metallization layer disposed over the silicon substrate upto a top surface of the silicon substrate.

7. The method of claim 1, further comprising applying a water-soluble protective coating prior to forming the groove.

8. The method of claim 1, wherein the silicon substrate comprises a silicon wafer.

9. A method of forming a semiconductor device, the method comprising:
    using a first laser process, forming a groove through a metallization layer disposed over a silicon substrate, the groove extending into the silicon substrate and the metallization layer coupled to device regions in the silicon substrate;
    using a second laser process, forming a dicing layer under the groove within the silicon substrate, wherein the second laser process is performed using multi-passing scanning process, and wherein a focal point of a laser beam of the second laser process is adjusted progressively deeper in each subsequent scan step of the multi-passing scanning process, wherein using the first laser process comprises using a laser ablation process using light at a wavelength between ultraviolet and infrared, and wherein using the second laser process comprises using a stealth laser process using light at a wavelength above 900 nm;
    attaching the silicon substrate to a tape; and
    performing a tape expansion process on the tape with the silicon substrate, wherein performing the tape expansion process comprises forming a crack from the groove through the dicing layer by expanding the tape.

10. The method of claim 9, wherein the first laser process is a laser ablation process, and wherein the second laser process is a stealth laser dicing process.

11. The method of claim 10, wherein the first laser process is a single scan process.

12. The method of claim 10, wherein the first laser process is performed from a first side of the silicon substrate, and wherein the second laser process is performed from an opposite second side of the silicon substrate.

13. The method of claim 9, wherein the second laser process uses light of wavelength greater than 1000 nm.

14. The method of claim 9 wherein expanding the tape comprises heating the tape.

15. The method of claim 9, wherein the groove is formed within a dicing channel on the silicon substrate, and wherein the dicing layer is formed within the dicing channel of the silicon substrate.

16. The method of claim 9, wherein the groove has a depth of about 5 µm to about 20 µm in the silicon substrate.

17. The method of claim 9, further comprising applying a water-soluble protective coating prior to forming the groove.

18. The method of claim 9, further comprising thinning the silicon substrate prior to forming the groove.

19. The method of claim 9, further comprising thinning the silicon substrate after forming the groove.

20. A method of forming a semiconductor device, the method comprising:
- using a first laser process, forming a groove through a metallization layer disposed over a silicon substrate, the groove extending into the silicon substrate and the metallization layer coupled to device regions in the silicon substrate;
- using a second laser process, forming a dicing layer under the groove within the silicon substrate, wherein the second laser process is performed using multi-passing scanning process, and wherein a focal point of a laser beam of the second laser process is adjusted progressively deeper in each subsequent scan step of the multi-passing scanning process, wherein using the first laser process comprises using a laser ablation process using light at a wavelength between ultraviolet and infrared, and wherein using the second laser process comprises using a stealth laser process using light at a wavelength above 900 nm;
- attaching the silicon substrate to a tape; and
- performing a tape expansion process on the tape with the silicon substrate by heating the tape.

21. The method of claim 20, wherein the first laser process is a laser ablation process, and wherein the second laser process is a stealth laser dicing process.

22. The method of claim 21, wherein the first laser process is a single scan process.

23. The method of claim 21, wherein the first laser process is performed from a first side of the silicon substrate, and wherein the second laser process is performed from an opposite second side of the silicon substrate.

24. The method of claim 20, wherein the second laser process uses light of wavelength greater than 1000 nm.

25. The method of claim 20, wherein the groove is formed within a dicing channel on the silicon substrate, and wherein the dicing layer is formed within the dicing channel of the silicon substrate.

26. The method of claim 20, wherein the groove has a depth of about 5 μm to about 20 μm in the silicon substrate.

27. The method of claim 20, further comprising applying a water-soluble protective coating prior to forming the groove.

28. The method of claim 20, further comprising thinning the silicon substrate prior to forming the groove.

29. The method of claim 20, further comprising thinning the silicon substrate after forming the groove.

* * * * *